(12) United States Patent
Vuolteenaho

(10) Patent No.: US 6,647,247 B2
(45) Date of Patent: *Nov. 11, 2003

(54) METHOD FOR PRODUCING TRANSMISSION FREQUENCY

(75) Inventor: Merja Vuolteenaho, Helsinki (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/566,728

(22) Filed: Dec. 4, 1995

(65) Prior Publication Data

US 2002/0037704 A1 Mar. 28, 2002

(30) Foreign Application Priority Data

Dec. 15, 1994 (FI) .................................. 945902

(51) Int. Cl.⁷ ............................................... H04B 1/40
(52) U.S. Cl. ............................... 455/76; 455/78; 455/86
(58) Field of Search .............................. 455/23, 71, 76, 455/112, 260, 118, 113, 85, 86, 87, 84; 332/128, 103; 370/281

(56) References Cited

U.S. PATENT DOCUMENTS

| | | | | |
|---|---|---|---|---|
| 4,739,288 A | * | 4/1988 | Ide et al. ..................... | 332/100 |
| 5,021,754 A | * | 6/1991 | Shepherd et al. ............ | 332/128 |
| 5,060,309 A | * | 10/1991 | Narita ......................... | 359/154 |
| 5,291,074 A | | 3/1994 | Nayebi ........................ | 307/353 |
| 5,291,474 A | * | 3/1994 | Ikonen et al. ................ | 370/281 |
| 5,301,367 A | | 4/1994 | Heinonen .................... | 455/76 |
| 5,319,799 A | * | 6/1994 | Morita ......................... | 455/78 |
| 5,390,168 A | | 2/1995 | Vimpari ....................... | 370/30 |
| 5,392,460 A | * | 2/1995 | Mattila et al. ................ | 455/76 |
| 5,483,679 A | * | 1/1996 | Sasaki ......................... | 455/86 |
| 5,519,885 A | * | 5/1996 | Vaisanen ..................... | 455/76 |
| 5,689,820 A | * | 11/1997 | Nahear et al. ............... | 455/86 |

FOREIGN PATENT DOCUMENTS

| | | |
|---|---|---|
| EP | 0218 406 | 4/1987 |
| EP | 0551 573 | 7/1993 |
| GB | 2098 419 | 11/1982 |
| WO | WO 91/18464 | 11/1991 |
| WO | WO 93/16530 | 8/1993 |

OTHER PUBLICATIONS

"Frequency Synthesizers Theory and Design" Manassewitsch; V. Wiley & Sons, 1975, p. 471.

* cited by examiner

Primary Examiner—Lee Nguyen
(74) Attorney, Agent, or Firm—Perman & Green, LLP

(57) ABSTRACT

The output frequency of a frequency synthesizer (21) according to the present invention is a multiple of a transmission frequency and said output frequency is divided before modulation to produce the transmission frequency (fTX). In an advantageous embodiment, the frequency synthesizer produces a frequency that is twice the transmission frequency, which is divided by a divide-by-2 divider to produce 90°-phase-shifted transmission frequency components required by a transmission frequency quadrature modulator. A simple, disturbance-tolerant transmitter construction is achieved by means of the present invention.

6 Claims, 2 Drawing Sheets

METHOD FOR PRODUCING TRANSMISSION FREQUENCY

CROSS-REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention
2. Description of the Related Art Including Information Disclosed Under 37 CFR 1.97 AND 1.98

In the competitive field of radio telephones, product development is influenced the most by the quest to minimize their manufacturing costs, size and current consumption. In future design of radio telephones, work will be focused particularly on developing new system designs for a radio frequency module, because the rf-module takes up approximately one half of the area of the printed circuit board of a telephone and accounts for a large portion of the manufacturing costs.

The simplest transmitter of the prior art can be implemented by means of a transmission frequency synthesizer. In using a transmission frequency synthesizer, modulation is added directly to the transmission frequency, whereupon the transmitter, as shown in FIG. 1, includes only a synthesizer 11, a modulator 12, and possibly a bandpass filter 13 and a power amplifier 14. Two frequency components separated by 90 degrees phase shift and required by the quadrature modulator 12, are usually produced from the transmission frequency transmission signal $f_1$ of the synthesizer 11 by means of a divide-by-2 divider 15, providing good phase accuracy. Therefore, the signal also must be multiplied by two by means of a multiplier 16 before it enters the divider 15 to preserve the transmission frequency. The bandpass filter 13 is often needed because of noise caused by the modulator 12, even though the transmission frequency $f_{TX}$ is produced without intermediate frequencies. Said construction offers a notable savings in components compared to a transmitter based on an intermediate frequency, and thereby, in principle, it is possible to achieve the goals in manufacturing costs, size and current consumption mentioned above. The savings in components are mainly based on the fact that the transmitter does not require a mixer stage as conventional heterodyne constructions do, nor offset oscillators that produce local frequencies.

However, there are several problems associated with a transmitter construction based on a transmission frequency synthesizer. In digital telephones based on time-division technology, transmission is allowed only during a transmission time period, resulting in burst-like transmission. It is known that burst-like transmission causes strong electromagnetic disturbances in the surroundings. The disturbances are particularly detrimental to a synthesizer operating at the same frequency as the transmission, because said disturbances are easily coupled to the voltage-controlled oscillator of the synthesizer, either electromagnetically or along a signal path, due to insufficient isolation. In continuously operating analog radio telephones, in which transmission and reception occur simultaneously along different channels, the problem is that modulation added to the transmission frequency is coupled to the voltage-controlled oscillator of the transmission frequency synthesizer, which advantageously also produces the local frequency of the receiver. The error caused in the local frequency of the receiver by the modulation of the transmission becomes mixed to the intermediate frequency in the receiver, causing residual modulation in the reception signal, thereby disturbing its detection. A similar problem is also possible in a continuously operating CDMA system.

Electromagnetically coupled disturbances can be minimized with good rf shielding, which, in this case, should be directed to not only the case of the radio telephone, but to the entire frequency synthesizer construction. However, rf shielding consumes space on the printed circuit board and complicates manufacture of the device to the extent that space and cost savings realized by implementing a transmission frequency synthesizer are at least partly lost.

The case of a radio telephone is usually designed to protect the device from external electromagnetic disturbances. If the transmitter is based on a synthesizer operating at transmission frequency, product development and production testing of at least the transmission frequency synthesizer must be performed with the case in place to minimize the effects on the synthesizer of disturbances originating in the transmitter of the device itself. Naturally, this hinders efficient testing.

The object of the present invention is to provide a simple frequency synthesizer construction by which means the problems described above caused by coupling of electromagnetic disturbances are at least partly eliminated. By applying the present invention, it is possible to manufacture a radio telephone with low manufacturing costs, small size and low current consumption. The present invention is characterized by what is presented in the characterizing part of claims 1 and 5.

BRIEF SUMMARY OF THE INVENTION

The output frequency of the frequency synthesizer of the present invention is a multiple of the transmission frequency, which is divided before modulation to produce the transmission frequency. In an advantageous embodiment, the frequency synthesizer produces a frequency that is twice the transmission frequency, which is divided by means of a divide-by-2 divider to produce the frequency components separated by 90 degrees phase shift and required by the quadrature modulator. The modulated signal, which in this case suitably is of transmission frequency, is filtered conventionally with a bandpass filter, eliminating all signal components except those belonging to the transmission channel, thereby preventing power amplification of the frequency produced by the synthesizer, which is twice the transmission frequency, and thereby preventing the disturbances described above.

The present invention is described in detail below, with references to the enclosed drawings.

DETAILED DESCRIPTION OF THE INVENTION

Figure 1:
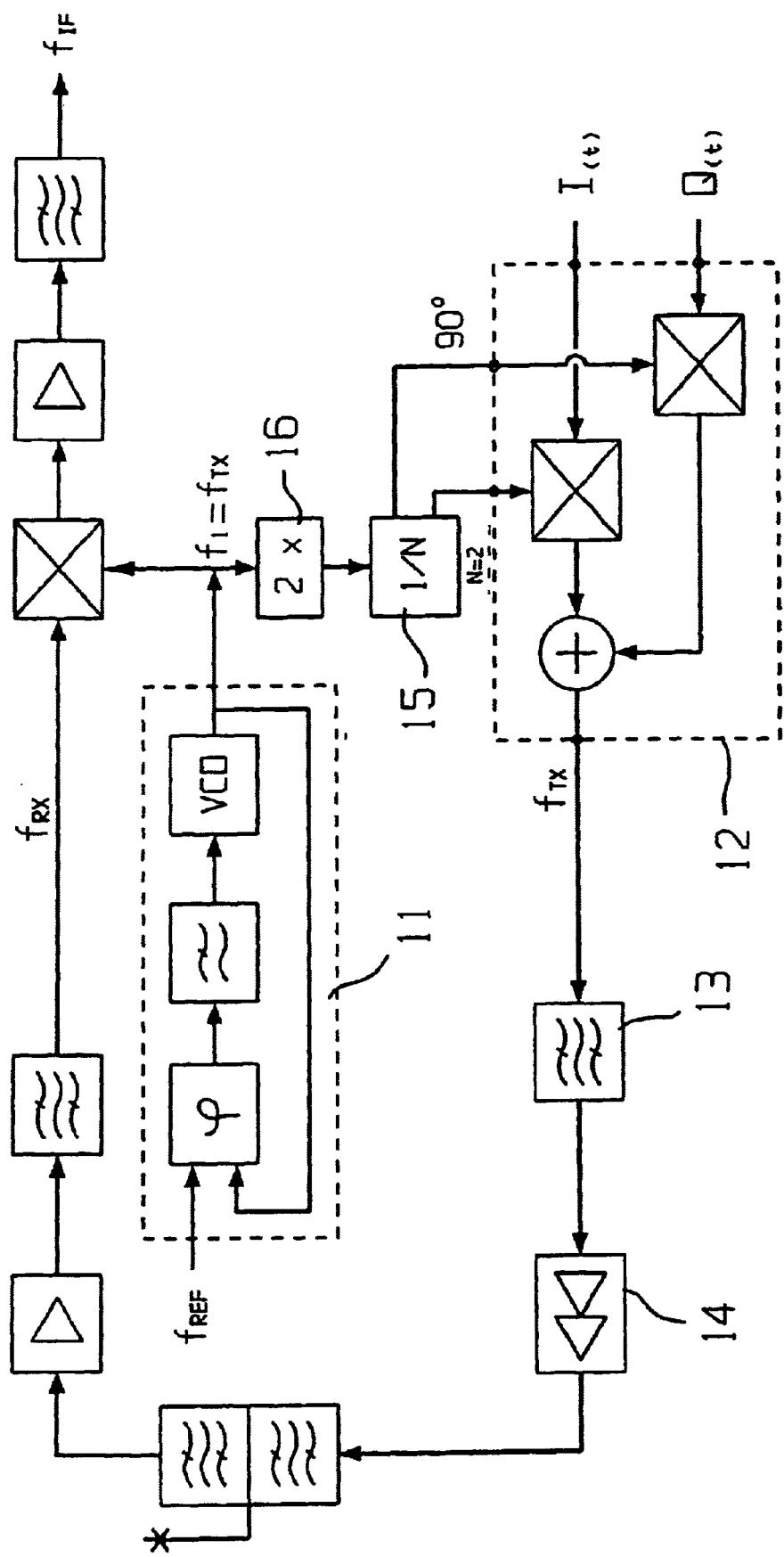
FIG. 1 shows a transceiver according to the prior art, which includes a synthesizer operating at transmission frequency.
Figure 2:
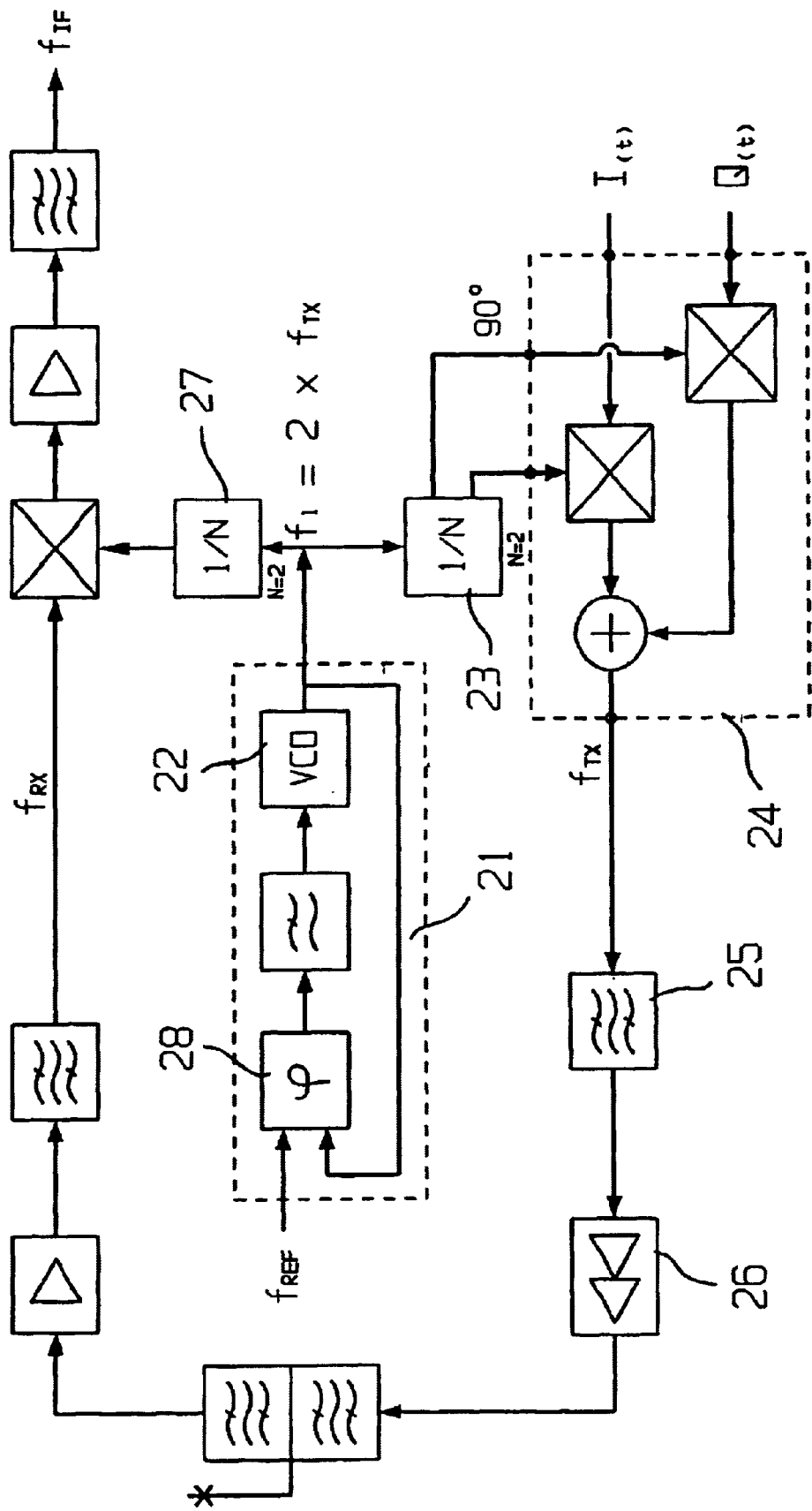
FIG. 2 shows a transceiver in which a transmission frequency is produced by means of a frequency synthesizer according to the present invention.

The prior art shown in FIG. 1 is presented earlier in the present application. A transmission frequency $f_{TX}$ of the transceiver shown in FIG. 2 is produced with a synthesizer 21 based on a phase-locked loop according to the present invention, whose voltage-controlled oscillator 22 has an output frequency $f_1$, which is twice the transmission frequency $f_{TX}$. The output frequency $f_1$ of said synthesizer is divided by means of a divide-by-2 divider 23 for lowering said output frequency to the transmission frequency $f_{TX}$. At the same time the two frequency components separated by 90 degrees phase shift are produced and introduced to a quadrature modulator 24.

Modulation is implemented by means of a known method of multiplying said frequency components respectively by modulation coefficients I(t) and Q(t) and summing the results together. The output signal of said modulator is input to a bandpass filter 25 to eliminate undesired frequency components before amplification by means of a power amplifier 26. Filtration, and partly the divider 23, as well as the adaptation of the transmission chain to the transmission frequency, eliminate the frequency components having the output frequency $f_1$ of said voltage-controlled oscillator 22, which are critical from the point of view of synthesizer operation, thereby noticeably decreasing the amount of electromagnetic disturbances that are coupled to the voltage-controlled oscillator 22.

If the frequency synthesizer that produces the multiple of the transmission frequency is also used to produce a local frequency of the receiver, the output frequency of the synthesizer must be divided by a divisor corresponding to the multiple before mixing in the receiver, in order to produce a frequency equal to the duplex interval, generally used as the first intermediate frequency of the receiver. As shown in FIG. 2, the output frequency $f_1$ of the synthesizer is divided by means of a divide-by-2 divider 27, whereby an intermediate frequency $f_{IF}$ is produced, which is equal to the duplex interval of the transmission and reception channels, this being 45 MHz in many radio telephone systems. This eliminates the disturbances in the detection of the received signal which are caused by residual modulation typically associated with a synthesizer operating at the transmission frequency, and also eliminates problems, caused by this type of synthesizer, associated with other radio telephone systems that simultaneously transmit and receive, such as CDMA systems.

Generally, the frequency produced by the frequency synthesizer according to the present invention is N times the transmission frequency and it is divided before modulation by a divisor N to produce the transmission frequency. Coefficient N is a whole number. In FIG. 2, a reference frequency $f_{REF}$, which is input to a phase comparator 28 of the synthesizer based on a phase-locked loop, must also be N times greater with respect to a solution according to the prior art, when a synthesizer is used that produces a frequency which is twice the transmission frequency.

It is particularly advantageous to use a synthesizer operating at a $2^n$ multiple of the transmission frequency, where n is a whole number, in conjunction with a quadrature modulator, because the 90°-phase-shifted frequency components are easy to produce by means of a divider. Several different modulations, such as $\pi/4$-DQPSK and GMSK, can be produced by means of a quadrature modulator.

By applying the present invention, the simple construction of a synthesizer operating at the transmission frequency can be preserved while eliminating the electromagnetic disturbances caused by the transmission of the device, which are coupled to the voltage-controlled oscillator. A transmitter according to the present invention that implements a quadrature modulator is even simpler in construction than a transmitter based on a synthesizer operating at the transmission frequency according to the prior art, because in the solution according to the present invention, multiply-by-2 multipliers are not necessary, as in the prior art, to raise the frequency back to the transmission frequency.

An UHF synthesizer according to the present invention is most feasibly used as a replacement for a synthesizer operating at the transmission frequency. The benefits of the present invention are realized in both digital and analog radio telephones, regardless of the type of modulation they employ. The present invention can be applied to the extent allowed in the accompanying claims.

What is claimed is:

1. A method for producing a transmission frequency and reception local frequency for a radio telephone by means of one frequency synthesizer, in which method modulation is implemented at said transmission frequency and a received signal is mixed down with a local frequency, said method comprising:

producing for a given radio telephone system an output frequency of the frequency synthesizer, dividing said output frequency by a divisor substantially equal to number N for producing said transmission frequency, and dividing said output frequency by a divisor substantially equal to the same number N for producing said reception local frequency.

2. The method according to claim 1, wherein frequency components separated by 90 degrees phase shift and required by quadrature modulation are obtained from the result of a division by N, and N is a $2^n$ multiple and n is a whole number.

3. The method according to claim 1, wherein the output frequency ($f_1$) of the frequency synthesizer is twice the transmission frequency ($F_{TX}$) and said output frequency ($f_1$) is divided by 2 for modulation.

4. A circuit for producing a transmission frequency and reception local frequency for a radio telephone by means of one frequency synthesizer, the radiotelephone having at least one modulator for implementing modulation for transmission on the transmission frequency, and at least one mixer for mixing down a reception signal with the local frequency, said circuit comprising:

at least one divider connected between the frequency synthesizer and the modulator for producing the transmission frequency;

at least one divider connected between the frequency synthesizer and the mixer for producing the local frequency, wherein for a given radio telephone system the combined division ratio of the said divider(s) is the same number 1/N for producing said transmission frequency and for producing said local frequency.

5. The circuit according to claim 4, wherein said dividers comprise the same divider.

6. A method for producing a transmission frequency and a local frequency for a receiver by means of one frequency synthesizer, in which method modulation is implemented at said transmission frequency and a received signal is mixed down with the local frequency, the method comprising:

synthesizing a frequency;

dividing the frequency by a factor for producing the transmission frequency for modulation; and dividing the frequency by said same factor for producing the local frequency for mixing down a received signal.

* * * * *